United States Patent [19]

Kondo et al.

[11] Patent Number: 4,649,070

[45] Date of Patent: Mar. 10, 1987

[54] SUBSTRATE FOR AN INTEGRATED CIRCUIT

[75] Inventors: Kazuo Kondo; Tsuneyuki Sukegawa, both of Aichi, Japan

[73] Assignee: NGK Spark Plug Co., Ltd., Nagoya, Japan

[21] Appl. No.: 808,565

[22] Filed: Dec. 13, 1985

[30] Foreign Application Priority Data

Dec. 14, 1984 [JP]  Japan .................. 59-265145

[51] Int. Cl.$^4$ .................. B32B 3/00; B32B 15/04
[52] U.S. Cl. .................. 428/209; 428/210; 428/450; 428/697; 428/901
[58] Field of Search ............. 428/209, 210, 697, 450, 428/901

[56] References Cited

U.S. PATENT DOCUMENTS 2,053,244  9/1936  Turk .................. 428/210
4,540,671  9/1985  Kondo et al. .................. 501/9
4,608,316  8/1986  Toda et al. .................. 428/210

FOREIGN PATENT DOCUMENTS 166285  8/1985  Japan .................. 428/210

Primary Examiner—William J. Van Balen
Attorney, Agent, or Firm—Finnegan, Henderson, Farabow, Garrett & Dunner

[57] ABSTRACT

A substrate for supporting an integrated circuit made of a ceramic member with a thin film of conductive metal applied to the ceramic member. The ceramic member consists essentially of a sintered ceramic material capable of forming a surface finish upon sintering, having a roughness that is less than 10 times the thickness dimension of the conductive film applied thereto. The ceramic material is either crystalline glass or a glass-coated ceramic.

6 Claims, No Drawings

SUBSTRATE FOR AN INTEGRATED CIRCUIT

BACKGROUND OF THE INVENTION

The present invention relates to ceramic substrates for IC packages used in single layer flat packages, multi-chip mounting substrates, pressure sensor substrates, and the like, and particularly to a substrate for an IC package in which no grinding is required to fabricate the substrate.

Conventionally, a substrate for an IC package (hereinafter referred to as "IC substrate") to be used in a single layer flat package, a multi-chip mounting substrate, a pressure sensor substrate, and the like, has been manufactured through the following steps:

(1) Comminuting, mixing and drying the raw materials;
(2) Molding the mix;
(3) Sintering;
(4) Grinding; and
(5) Metallizing a portion of the device.

The quality of the IC substrate is affected by all the fabrication steps. Such devices are particularly affected by the grinding step, as well as the succeeding metallizing step. This is because an electrically conductive film is formed on the ceramic IC substrate in the configuration of a circuit. Therefore, the degree of smoothness (microscopic unevenness) and the degree of flatness (macroscopic unevenness) on the surface of the conductive film is critical in order to keep the accuracy of the circuit.

Such a requirement is particularly significant where the IC substrate receives a metallized film through the formation of a thin film by a process such as vacuum evaporation, sputtering, or the like. Because the film formed through vacuum evaporation or sputtering has a thickness of about 1 $\mu$m, the surface roughness of the substrate is required to be 0.1 to 0.2 $\mu$m, that is one order of magnitude lower than the thickness of the film. Early in the development of such devices, slide glasses for a microscope were substituted for thin film IC substrates. Such slide glasses have a smooth ground surface and were available at a low cost. Later, glass substrates intended for such a use were produced. Alumina substrates having glazed surfaces and having superior mechanical and thermal characteristics have also been produced in a quest for more highly reliable substrates. However, even those substrates were not completely adequate in the desired characteristics, and alumina substrates coated with a very thin glass layer or alumina substrates with their surfaces ground smooth have been used as improved substrates.

The manufacturing of such glass-coated alumina substrates involves several additional steps that reduce production rates. Further, in the case where the surfaces of the alumina substrates are ground smooth, there are disadvantages because the surface particles may come off, impurities may be mixed thereinto, and so forth.

In order to solve these problems, alumina substrates which can be metallized without prior grinding have been developed by using high purity alumina. However, such materials have the disadvantage that sintering temperature is high, the dielectric constant and the coefficient of expansion are relatively large, and the manufacturing cost is excessive.

SUMMARY OF THE INVENTION

In order to achieve these and other objects of the invention, there is provided a substrate for supporting an integrated circuit device. The substrate is comprised of a ceramic material with a thin film of conductive metal applied to selective portions thereof. The ceramic member consists essentially of a sintered ceramic material capable of achieving a surface finish upon sintering of a roughness factor of about ten times less than the thickness of the thin film. The ceramic material is selected from the group consisting of crystalline glasses and glass-coated ceramic compositions.

Preferably where the ceramic material is a crystalline glass, it consists essentially of from 55 to 63 weight % $SiO_2$, 20 to 28 weight % $AL_2O_3$, 10 to 18 weight % MgO and 2 to 6 weight % ZnO. From 0.1 to 6 weight % of an additive selected from the group $B_2O_3$, $P_2O_5$ or mixtures thereof is preferably added. The ceramic mixture is formed into the ceramic member by comminuting the material to a powder, molding the powder into a preform and sintering the preform into the sintered ceramic article. It is also preferred that where the ceramic material is a glass-coated ceramic composition, the ceramic material comprises a mixture of ceramic particles having a layer of $SiO_2$ thereon in a matrix, wherein the matrix is selected from the group consisting of a glass and a crystalline glass. It is further preferred that in such an embodiment the ceramic particles are comprised of 50 to 60 volume percent of the ceramic composition with the ceramic composition having a coefficient of thermal expansion in the range of from 5 to 45 times $10^{-7}$.

DESCRIPTION OF THE PREFERRED EMBODIMENTS

The present invention has made it possible to omit the grinding steps from the process of making IC substrates by finding suitable materials which make it possible to obtain substrates which are superior in electrical, mechanical and thermal characteristics. The materials provide a degree of smoothness, as well as a degree of flatness of the substrate surface such that metallizing through thin film processes can be carried out after sintering even if the substrates are not subjected to surface grinding.

The crystalline glass body or the glass-ceramic complex body to be used according to the present invention may be those as follows:

The crystalline glass body as disclosed, for example, in U.S. Pat. No. 4,540,671 prepared in such a manner that the crystalline glass component consisting essentially of 55 to 63 weight % of $SiO_2$, 20 to 28 weight % of $Al_2O_3$, 10 to 18 weight % of MgO, and 2 to 6 weight % of ZnO, and 0.1 to 6 weight % of an additive component selected from the group consisting of $B_2O_3$ and/or $P_2O_5$. The components are comminuted and mixed into a powder, molded and sintered to form the crystalline glass material.

The substrate may also be a glass-ceramic complex body as disclosed, for example, in Unexamined patent Publication No. 59-64545, prepared in such a manner that 5 to 60 volume % of the ceramic particles are covered with $SiO_2$ over their surface. The coated particles are dispersed in glass or crystallized glass having a coefficient of expansion of 5 to $45 \times 10^{-7}$;

The substrate may also be a crystalline glass body as disclosed, for example, in Unexamined Patent Publication No. 59-83957, prepared in such a manner that the crystalline glass consists essentially of 40 to 52 weight % of $SiO_2$, 27 to 37 weight % of $Al_2O_3$, 10 to 20 weight % of MgO, 2 to 8 weight % of CaO, and 0.1 to 3 weight % of $ZrO_2$. The components are comminuted and mixed into a powder, molded and sintered to form the crystalline glass material.

The substrate may also be a crystalline glass body, as disclosed for example in Patent Unexamined Publication No. 59-137341, prepared in such a manner that the crystalline glass consists essentially of 55 to 63 weight % of $SiO_2$, 20 to 28 weight % of $Al_2O_3$, 1 to 8 weight % of $Y_2O_3$, and 10 to 20 weight % of MgO, and 0.1 to 5 weight % additive selected from the group consisting of $B_2O_3$ and/or $P_2O_5$. The components are comminuted and mixed into a powder, molded and sintered to form the crystalline glass material.

All the substrates made of the foregoing sintering materials have the degree of surface smoothness and the degree of surface flatness which are sufficient to omit the grinding step. These materials can be formed into smooth substrates after molding through an ordinary process, such as a green sheet process, a metal-mold pressing process, or the like. They have superior electrical, mechanical and thermal characteristics such that the dielectric constant is low and the coefficient of expansion is the same degree as an Si chip.

Further, those materials described above have a feature that they can be sintered at a temperature significantly lower than alumina.

The electrically conductive layer formed through a thin film process, such as vacuum evaporation, sputtering, or the like, is required to be superior in heat-resistance and be intimately and strongly bonded to the substrate. As such materials, for example, it is possible to use metals in 4A-group (Ti, Zr, Hf), 5A-group (V, Nb, Ta), and 6A-group (Cr, Mo, W) and the compounds thereof, for example, TaN, CrNi, TaAl, TaAlN, TaSi, Cr-SiO, etc.

According to the present invention, manufacturing of an IC package substrate can be simplified. As a result of omitting the grinding process, contamination with surface particles and the mixture of impurities can be avoided which might result in problems in the process of grinding alumina substrates or the like. Thus, it is possible to provide IC package substrates which are superior in characteristics.

The IC package substrates according to the present invention can be easily manufactured because they can be sintered at a temperature lower than 99.5% alumina substrates, and they have significant advantages from an economical point of view because they have substantially the same surface roughness as the latter.

Further, the IC package substrates according to the present invention have a dielectric constant lower than that of alumina substrates and a coefficient of heat expansion substantially the same degree as an Si chip and, therefore, they are extremely useful as a substrate therefor.

Samples having such compositions are shown in Table 1. They were molded through a green sheet process, sintered at 900° to 1000° C., and then subject to measurement of their surface roughness. The degree of surface roughness was measured as a center line average roughness (Ra) on the basis of JIS B0601 under the condition of 4 mm measured length and 0.8 mm cut-off value.

Next, a metal film having a thickness of 1000 to 2000 Å and a shape of square of $2 \times 2$ mm$^2$ was formed on the surface of each of the samples through a high-frequency sputtering process with Ti, Mo, and Ni. The degree of adhesion between the metal film and the substrate was measured to obtain the peeling strength at the contacting portion of a metal wire (0.6 mm $\phi$ Sn-plated Cu wire) soldered (with a solder consisting of 60% of Sn and 40% of Pb).

As a result of the above-mentioned experiments, it has been found that the IC package substrate, according to the present invention, has a surface roughness of substantially the same degree, even in a non-ground state, as a substrate of 99.5% alumina or an alumina substrate with its surface ground.

Further, it was confirmed that the adhesion with the metal film was sufficient.

TABLE 1

| Sample No. | Component (weight %) | | | | | | Surface roughness μm Ra | Peeling strength kg/4 mm$^2$ | Dielectric constant (1 MHz) | Thermal expansion coef. × 10$^{-7}$/°C. | |
|---|---|---|---|---|---|---|---|---|---|---|---|
| | SiO$_2$ | Al$_2$O$_3$ | MgO | B$_2$O$_2$ | Other Component | | | | | | |
| 1 | 56.0 | 23.5 | 15.0 | 1.0 | ZnO 3.5 | P$_2$O$_5$ 1.0 | 0.10 | >5 | 5.5 | 30 | Patent Unexamined Public. 59-92943 |
| 2 | 57.5 | 25.5 | 12.0 | 2.0 | ZnO 2.5 | P$_2$O$_5$ 0.5 | 0.12 | >5 | 5.2 | 25 | Patent Unexamined Public. 59-92943 |
| 3 | 52.0 | 20.0 | 17.0 | 2.0 | TiO$_2$ 7.0 | P$_2$O$_5$ 2.0 + AO 20 vol % | 0.15 | >5 | 5.5 | 37 | Patent Unexamined Public. 59-64545 |
| 4 | 52.0 | 20.0 | 17.0 | 2.0 | TiO$_2$ 7.0 | P$_2$O$_5$ 2.0 + BN 20 vol % | 0.20 | >5 | 5.0 | 32 | Patent Unexamined Public. 59-64545 |
| 5 | 45.0 | 32.0 | 12.0 | 4.5 | CaO 4.5 | ZrO$_2$ 2.0 | 0.15 | >5 | 5.5 | 22 | Patent Unexamined Public. 59-83957 |
| 6 | 50.0 | 30.0 | 13.0 | 3.0 | CaO 3.0 | ZrO$_2$ 1.0 | 0.10 | >5 | 5.6 | 16 | Patent Unexamined Public. 59-83957 |
| 7 | 58.0 | 22.0 | 12.0 | 1.0 | Y$_2$O$_3$ 6.0 | ZrO$_2$ 1.0 | 0.10 | >5 | 5.7 | 35 | Patent Unexamined Public. 59-137341 |
| 8 | 55.0 | 17.0 | 21.0 | 3.0 | Y$_2$O$_3$ 3.0 | ZrO$_2$ 1.0 | 0.13 | >5 | 5.5 | 30 | Patent Unexamined Public. 59-137341 |
| Comp. 1 | Al$_2$O$_3$ 96% Remainder SiO$_2$—CaO—MgO—BaO glass | | | | | | 0.30 | 3.0 | 9.0 | 67 | |
| Comp. 2 | Al$_2$O$_3$ 99.5% Remainder SiO$_2$—CaO—MgO—BaO glass | | | | | | 0.08 | >5 | 9.8 | 68 | |
| Comp. 3 | Al$_2$O$_3$ 82% Remainder SiO$_2$—CaO—MgO—BaO glass | | | | | | 1.50 | Immeasurable | 8.5 | 66 | Metallizing by thin film method was impossible. |

TABLE 1-continued

| Sample No. | Component (weight %) | | | | | Surface roughness μm Ra | Peeling strength kg/4 mm² | Dielectric constant (1 MHz) | Thermal expansion coef. × $10^{-7}$/°C. |
| --- | --- | --- | --- | --- | --- | --- | --- | --- | --- |
| | $SiO_2$ | $Al_2O_3$ | MgO | $B_2O_2$ | Other Component | | | | |
| Comp. 4 | The surface of the Comp. 3 was ground. | | | | | 0.20 | 3.0 | 8.5 | 66 |

Samples 1-8 are products according to the invention and Comp. 1-4 are comparison examples.

The present invention has been disclosed in terms of preferred embodiments. The scope of the invention is not limited thereto. The scope of the invention is determined by the appended claims and their equivalents.

What is claimed is:

1. A substrate for supporting an integrated circuit device, said substrate being comprised of a ceramic member with a thin film of conductive metal applied to selective portions thereof, said ceramic member consisting essentially of a sintered ceramic material capable of forming a surface finish upon sintering of a roughness, a factor of about ten times less than the thickness of said thin film, said ceramic material being selected from the group consisting of crystalline glasses and glass-coated ceramic compositions.

2. The substrate of claim 1 wherein said ceramic material is a crystalline glass consisting essentially of from 55 to 63% weight, $SiO_2$, 20 to 28 weight % $Al_2O_3$, 10 to 18 weight % MgO and 2 to 6 weight % ZnO and from 0.1 to 6 weight % of an additive selected from the group of $B_2O_3$, $P_2O_5$ or mixtures thereof, said ceramic material being formed into said ceramic member by comminuting said material to a powder, molding said powder into a preform and sintering said preform into said sintered ceramic article.

3. The substrate of claim 1 wherein said ceramic material is a glass coated ceramic composition, said ceramic material comprising a mixture containing ceramic particles having a layer of $SiO_2$ thereon in a matrix wherein said matrix is selected from the group consisting of a glass and a crystalline glass, said ceramic particles comprising from 5 to 60 volume % of said ceramic composition, said ceramic compositions having a coefficient of thermal expansion in the range of from 5 to $45 \times 10^{-7}$.

4. The substrate of claim 1 wherein said ceramic material is a crystalline glass consisting essentially of 40 to 52 weight % $SiO_2$, 27 to 37 weight % $Al_2O_3$, 10 to 20 weight % MgO, 2 to 8 weight % CaO, and 0.1-3 weight % $ZrO_2$, said ceramic material being formed into said ceramic member by comminuting said material to a powder, molding said powder into a preform and sintering said preform into said sintered ceramic article.

5. The substrate of claim 1 wherein said ceramic material is a crystalline glass consisting essentially of from 55 to 63% weight % $SiO_2$, 20 to 28 weight % $Al_2O_3$, 1 to 8 weight % $Y_2O_3$, and 10 to 20 weight % MgO, and from 0.1 to 5 weight % of an additive selected from the group consisting of $B_2O_3$, $P_2O_5$ and mixtures thereof, said ceramic material being formed into said ceramic member by comminuting said material to a powder, molding said powder into a preform and sintering said preform into said sintered ceramic article.

6. The substrate of claim 1 wherein said conductive film includes an element selected from groups 4A, 5A or 6A of the periodic table.

* * * * *